(12) United States Patent
Ma (10) Patent No.: US 6,781,437 B2
(45) Date of Patent: *Aug. 24, 2004

(54) ZERO STATIC POWER PROGRAMMABLE FUSE CELL FOR INTEGRATED CIRCUITS

(75) Inventor: Fan Yung Ma, Singapore (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/250,277

(22) Filed: Jun. 19, 2003

(65) Prior Publication Data

US 2003/0189457 A1 Oct. 9, 2003

Related U.S. Application Data

(63) Continuation-in-part of application No. 10/250,253, filed on Jun. 18, 2003, and a continuation-in-part of application No. 10/042,702, filed on Jul. 11, 2001, and a continuation-in-part of application No. 09/905,208, filed on Jul. 11, 2001, now Pat. No. 6,603,344.

(30) Foreign Application Priority Data

Jul. 4, 2002 (SG) .............................. PCT/SG02/00153

(51) Int. Cl.[7] ............................ G11C 7/00; H01H 37/76
(52) U.S. Cl. ................. 327/525; 365/225.7; 365/185.3
(58) Field of Search .............................. 327/524, 526, 327/525, 545; 365/225.7, 189.05, 185.3, 200, 96

(56) References Cited

U.S. PATENT DOCUMENTS

| 4,532,607 | A |   | 7/1985 | Uchida ........................ 365/96 |
| 4,546,455 | A |   | 10/1985 | Iwahashi et al. ............ 365/200 |
| 4,922,134 | A |   | 5/1990 | Hoffmann et al. ............ 326/13 |
| 5,047,664 | A |   | 9/1991 | Moyal ........................ 327/566 |
| 5,315,177 | A |   | 5/1994 | Zagar et al. .................. 326/44 |
| 5,345,110 | A |   | 9/1994 | Renfro et al. ............... 327/199 |
| 5,731,734 | A |   | 3/1998 | Pathak et al. ............... 327/525 |
| 5,929,691 | A |   | 7/1999 | Kim et al. ................... 327/525 |
| 6,021,067 | A | * | 2/2000 | Ha ........................ 365/185.21 |
| 6,087,890 | A |   | 7/2000 | Kim ........................... 327/526 |
| 6,175,261 | B1 | * | 1/2001 | Sundararaman et al. .... 327/525 |
| 6,201,750 | B1 |   | 3/2001 | Busch et al. ............. 365/225.7 |
| 6,215,351 | B1 |   | 4/2001 | Le et al. ..................... 359/688 |
| 6,236,599 | B1 |   | 5/2001 | Goto .......................... 365/194 |
| 6,256,239 | B1 | * | 7/2001 | Akita et al. ................. 365/200 |
| 6,281,739 | B1 | * | 8/2001 | Matsui ....................... 327/525 |
| 6,404,680 | B1 |   | 6/2002 | Kwon ...................... 365/185.3 |

FOREIGN PATENT DOCUMENTS

| EP | 0 528 744 A3 | 2/1993 |
| EP | 0 528 744 A2 | 2/1993 |
| EP | 0 947 993 A2 | 10/1999 |
| EP | 0 947 993 A3 | 6/2000 |
| JP | 58105497 | 6/1983 |
| JP | 2000021191 | 1/2000 |

OTHER PUBLICATIONS

"DC CMOS Fuse True/Complement Generator"; IBM Technical Disclosure Bulletin; vol. 30; No.: 12; May 1988; p. 51.

* cited by examiner

Primary Examiner—Dinh T. Le
(74) Attorney, Agent, or Firm—Horizon IP Pte Ltd (57) ABSTRACT

A software programmable fuse cell which reduces or eliminates static power consumption is disclosed. The programmable fuse cell can be operated in programmable and non-programmable operating modes. Depending on the operating mode, the fuse cell output is determined by the actual state of the fuse or which fuse state the fuse cell is simulating. To reduce static power consumption, a latch is used to store the actual or simulated fuse state.

19 Claims, 7 Drawing Sheets

ZERO STATIC POWER PROGRAMMABLE FUSE CELL FOR INTEGRATED CIRCUITS

CROSS REFERENCE TO RELATED APPLICATIONS

This application claims priority of international application, titled "Zero Static Power Programmable Fuse Cell for Integrated Circuits", PCT/SG02/00153 filed on Jul. 4, 2002 and is a continuation-in-part of patent applications, titled "Zero Static Power Programmable Fuse Cell for Integrated Circuits", U.S. Ser. No. 09/905,208 filed on Jul. 11, 2001, U.S. Pat. No. 6,603,344, and "Zero Static Power Fuse Cell for Integrated Circuits", U.S. Ser. No. 10/250,253 filed on Jun. 18, 2003, which claims priority of international application, titled "Zero Static Power Fuse Cell for Integrated Circuits", PCT/SG02/00152 filed on Jul. 4, 2002 and is a continuation-in-part of patent application, titled "Zero Static Power Fuse Cell for Integrated Circuits", U.S. Ser. No. 10/042,702 filed on Jul. 11, 2001, which are herein incorporated by reference for all purposes.

BACKGROUND OF INVENTION

Fuse cells are widely used in ICs in order to make the ICs tunable. For example, after an IC designed by an IC supplier is manufactured it may happen that, due to tolerance in the manufacturing process, the performance of the ICs is not what was intended. In this case, the performance of the ICs can be modified by cutting a selection of the fuses before the ICs are supplied to customers. As an example, fuse cells can be used to store addressing information of defective memory cells in an array for redundancy applications.

When the IC supplier contemplates cutting the fuses of an IC it may wish to check that the resulting performance of the IC will be what is desired. For that reason, it is known to provide circuitry on the IC for simulating the cut and uncut fuse states and which is controllable using control signals. Control signals are applied to the circuit to cause this circuitry to simulate the proposed cutting of fuses, and the performance of the IC is then investigated.

Figure 1:
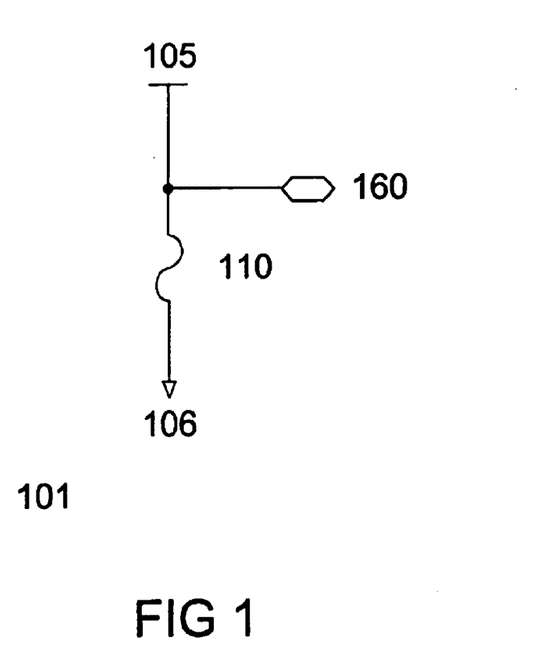
FIG. 1 shows a conventional fuse cell.

FIG. 1 shows a conventional fuse cell 101. The fuse cell typically includes a fuse 110 coupled between a pull-up circuit 105 (at a voltage (e.g. a positive voltage) which may represent a logic 1) and a pull-down circuit 106 (at a voltage (e.g. ground) which may represent a logic 0).

Depending on the state of the fuse (cut or uncut), the fuse cell 101 generates a fuse cell output signal at a fuse cell output terminal 160 which is commonly coupled to the fuse 110 and pull-up power source 105. As illustrated, the pull-down circuit 106 is decoupled from the power-up circuit 105 when the fuse is cut, producing a logic 1 fuse cell output signal at terminal 160. On the other hand, an uncut fuse couples the output terminal 160 to the pull-down circuit 106, thus generating a logic 0 output signal.

If the fuse is uncut, a current path exists between the power-up and power-down circuits 105, 106. As a result, power dissipates from the power-up circuit 105 to ground 106 when the fuse is uncut. This leads to an increase in power consumption, particularly since one of the design goals is to minimize the need to cut fuses in the IC. For low power or portable applications, particularly, the increased power consumption is undesirable and, in some cases, unacceptable.

As evidenced from the above discussion, it is desirable to provide an improved fuse cell with reduced or no static power dissipation.

SUMMARY OF INVENTION

The invention relates generally to fuse cells. In particular, the invention relates to software programmable fuses having reduced or no static power consumption.

In general terms, the present invention proposes that a fuse cell utilizes a latch for storing the state of the fuse. In a first operating mode, the latch is coupled to the fuse, and outputs a signal which depends on the state of the latch. In a second operating mode, the fuse cells are arranged to generate an output signal which is independent of the fuse state and instead determined by a software programmable fuse circuit under the control of control signals. In the first operating mode, the use of the latch avoids having a pull-up power source coupled to ground when the fuse is uncut as with conventional fuse cells.

In a first form of the invention, the fuse cell includes a control circuit, a fuse circuit, a software programmable fuse circuit, and a latch. The control circuit is coupled to the latch, fuse circuit and software fuse circuit. In response to fuse cell input signals, the control circuit causes the fuse cell to operate in either a first or second operating mode. In the first operating mode, the control circuit couples the latch to the fuse circuit, enabling the latch to store the fuse state. In the second operating mode, the control circuit puts the latch into a first logic state or a second logic state depending on the fuse state to be simulated.

In a second form of the invention, the fuse cell also includes a control circuit, a fuse circuit, a software programmable fuse circuit, and a latch. However, in this case the control circuit need only be coupled to the latch and the fuse circuit. The software programmable fuse circuit is connected to the output of the latch, and in response to fuse cell input signals outputs either a signal depending on the signal received from the latch or alternatively a signal determined by the fuse cell input signals. Note that it is not necessary that all components of the fuse cell are provided in the same block of the circuitry. Instead, it may be convenient to provide at least one fuse block including the control circuits, fuse circuits and latches of one or more of the fuse cells, and at least one softfuse block including the software programmable fuse circuit.

In either case, preferably, the control circuit can also be operated in a initialization mode. The control circuit further comprises an initialization circuit. During power-up, for example, an active initialization signal is generated to put the control circuit into the initialization mode. The active initialization signal couples the initialization circuit to the latch to initialize the latch to a first known state. After the latch has been initialized, the initialization signal becomes inactive and the fuse cell operates in either the first or second operating mode.

DETAILED DESCRIPTION

Figure 2:
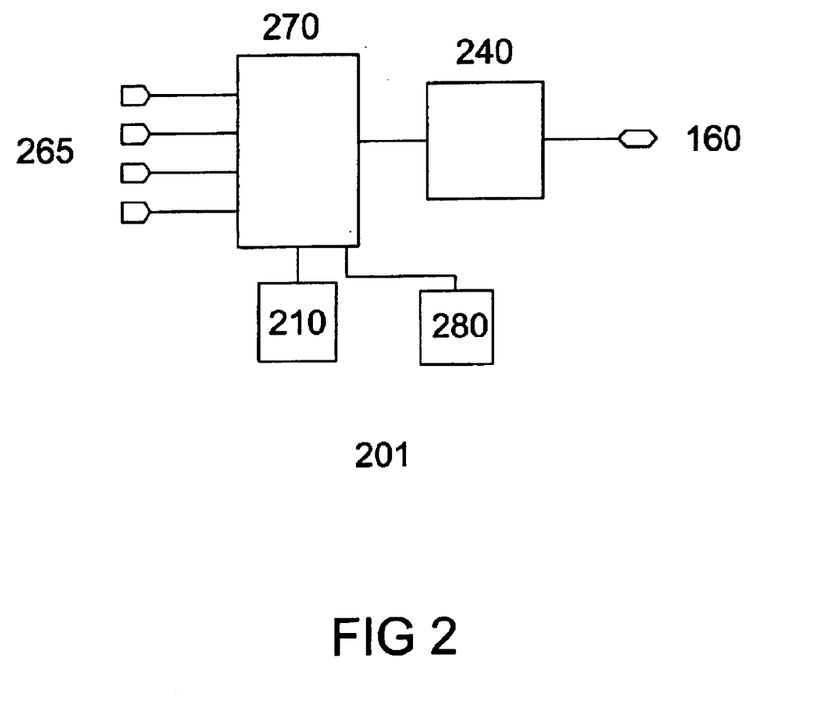
FIGS. 2–9 show fuse cells in accordance with various embodiments of the invention.

FIG. 2 is a block diagram of a software programmable fuse cell 201 in accordance with one embodiment of the invention. The software programmable fuse cell 201 comprises input terminals 265 for receiving control input signals, an output terminal 160, a control circuit 270, a fuse circuit 210, a software programmable fuse circuit 280, and a latch 240. The input terminals 265 are coupled to the control circuit 270 and the output terminal 160 is coupled to the latch 240. The latch 240, fuse circuit 210, and software fusing circuit 280 are coupled to the control circuit 270.

In one embodiment, the control circuit 270 includes an initialization circuit which sets the latch 240 to a known first state (e.g., a logic 1) when activated, such as during system power-up. While the fuse cell 201 is initialized, the fuse circuit 210 and software programmable fuse circuit 280 can be decoupled from the latch 240. After the fuse cell has been initialized, the fuse cell 201 can operate in first or second operating modes (programmable or non-programmable) as determined by the control input signals.

Generally, the initialization circuit is decoupled from the latch 240 when the fuse cell is operating in the programmable or non-programmable mode. In the non-programmable mode, the fuse circuit 210 is coupled to the latch 240. The latch 240 either remains in the first known state or switches to a second state, depending on whether the fuse is cut or uncut. In one embodiment, a cut fuse causes the latch 240 to remain in the first state (e.g., logic 1) while an uncut fuse switches the latch 240 to the second state (e.g., logic 0). When the fuse cell is operating in the programmable mode, the software fuse circuit 280 is activated to simulate either a cut or an uncut fuse state. The software programmable fuse circuitry, for example, causes the latch 240 to remain in the first state when simulating a cut fuse or switches it to the second state when simulating an uncut fuse. The latch 240 is selectively switched between first and second states depending on the fuse state to be simulated.

In one embodiment, the initialization circuit can be used to simulate the fuse state indicated by the latch 240 being in the first state (e.g., simulating a cut fuse state) while the software fuse circuitry 280 can be coupled to the latch 240 to switch the latch 240 from the first to the second state to simulate the fuse state indicated by the latch 240 being in the second state (e.g., simulating an uncut fuse state). Such application takes advantage of the existing initialization circuitry in the programmable mode. Alternatively, the software programmable fuse circuitry can selectively switch the latch between first and second states depending on the fuse state to be simulated.

Figure 3:
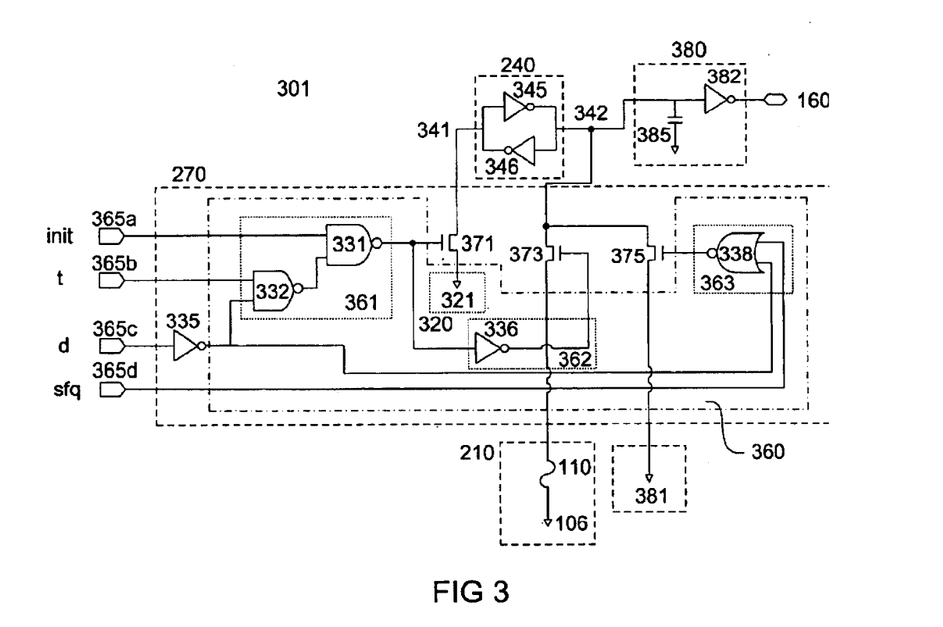

FIG. 3 shows a software programmable fuse cell 301 in accordance with one embodiment of the invention. The fuse cell 301 comprises input terminals 365a–d for receiving input control signals, an output terminal 160, a control circuit 270, a fuse circuit 210, software programmable fuse circuitry (composed collectively of the circuits 361, 363, 381), and a latch 240. The control circuit 270 includes an initialization circuit 320 composed of pull-down circuit 321. The input terminals 365a–d are coupled to the control circuit 270 and the output terminal 160 is coupled to the latch 240. The latch 240, fuse circuit 210, and software programmable fuse circuitry are coupled to the control circuit 270.

As shown in FIG. 3, the latch 240 includes first (input) and second (output) latch terminals 341 and 342 commonly coupled to first and second inverters 345 and 346 back-to-back. Other types of latches may be used in alternative embodiments. The first and second latch terminals 341, 342 are coupled to the control circuit 270.

The control circuit comprises first, second, and third switch transistors 371, 373, and 375. The switch transistors selectively couple and decouple the initialization and fuse circuits 320, 210 and the software programmable fuse circuitry to the latch 240 depending on the mode of operation. The switch transistors, for example, are n-FETs. Other types of transistors, such as p-FETs or a combination of n-FETs and p-FETs are also useful. The transistors are switched on or off (conductive or non-conductive) to couple or decouple the respective circuits to the latch.

In one embodiment, the first transistor 371 couples the initialization circuit 320 to the first latch terminal 341 and the second and third transistors 373, 375 respectively couple the fuse circuit 210 and software programmable fuse circuitry to the second latch terminal 342. The initialization circuit 320 and software programmable fuse circuitry each comprise a pull-down circuit (321 or 381) and the fuse circuit 210 comprises a fuse 110 coupled to a pull-down circuit 106. A ground or a logic 0 can be used to serve as a pull-down circuit.

The switch transistors 371, 373, 375 are selectively switched on or off depending on the mode of operation. Table 1 shows the states of the first, second, and third transistors (T1, T2, and T3) for the different fuse cell modes in accordance with one embodiment of the invention.

TABLE 1

| Transistor | Initialization | Non-programmable | Programmable (uncut fuse) | Programmable (cut fuse) |
|---|---|---|---|---|
| 371 | On | Off | Off | On |
| 373 | Off | On | On | Off |
| 376 | Off | Off | On | Off |

As shown by Table 1, the first transistor 371 is switched on while the second and third transistors 373, 375 are switched off to initialize the fuse cell. This couples the pull-down circuit 321 to the latch 240, setting the second latch terminal 342 to equal to a logic 1. After initialization, the fuse cell can operate in either the non-programmable or programmable mode.

In the non-programmable mode, the first and third transistors 371, 375 are switched off and the second transistor 373 is switched on. This decouples the initialization circuit 320 and software programmable fuse circuitry from the latch 240 while coupling the fuse circuit 210 to the latch 240. A cut fuse severs the pull-down circuit from the second latch terminal 342, allowing it to remain in the first logic state. On the other hand, an uncut fuse couples the pull-down circuit 106 to the second latch terminal 342, pulling it down to a logic 0.

In the programmable mode, the third transistor 375 is switched on or off depending on whether the fuse cell is simulating a cut or an uncut fuse state. To simulate an uncut fuse state, the third transistor 375 is switched on. This couples the pull-down circuit 381 to the latch 240, causing the second latch terminal 342 to be pulled-down to a logic 0.

Simulating a cut fuse state is achieved by switching off the third transistor 375 to allow the latch 240 to remain in the first state (logic 1).

In one embodiment, the latch 240 can be switched between the first and second states in the programmable mode by utilizing the initialization circuit 320 and software fuse circuitry. The initialization circuit 320 and software fuse circuit operate in a push-pull configuration in the programmable mode. For example, to simulate a cut fuse state, the first transistor 371 is on while the third transistor 375 is off. Simulating an uncut fuse state can be accomplished by switching on the third transistor 375 and switching off the first one 371.

In one embodiment, the first and second transistors 371, 373 are configured to operate in a push-pull fashion. By operating the first and second transistors 371, 373 in such a manner, either the initialization or fuse circuit is coupled to the latch 240 at one time. This ensures that the first and second latch terminals are not in conflict.

The fuse cell 301, in one embodiment, receives the following input control signals at the input terminals: initialization (init) to terminal 365a, mode (t) to terminal 365b, enable software fuse circuitry signal (d) to terminal 365c, and simulated fuse state signal (sfq) to terminal 365d. The input signals are provided to a control logic having output terminals respectively coupled to the gates of the transistors 371, 373, 375. The control logic generates output signals at the output terminals in response to the input signals to control the operation of the transistors 371, 373, 375 in the different operating modes. Table 2 shows the input signals and corresponding operating mode in accordance with one embodiment of the invention.

TABLE 2

|  | Initialization –371 is on 373 is off 375 is off | Non Programmable 371 is off 373 is on 375 is off | Programmable (uncut fuse) 371 is off 373 is on 375 is on | Programmable (cut fuse) 371 is on 373 is off 375 is off |
| --- | --- | --- | --- | --- |
| init | active (logic 0) | inactive (logic 1) | inactive (logic 1) | inactive (logic 1) |
| t | don't care | inactive (logic 0) | active (logic 1) | active (logic 1) |
| sfg | inactive (logic 1) | inactive (logic 1) | active (logic 0) | active (logic 0) |
| d | don't care | don't care | inactive (logic 1) | active (logic 0) |

As shown, the input control signals except for t are active low signals. The fuse cell is initialized by providing an active init (logic 0) to terminal 365a and an inactive sfq signal (logic 1) to terminal 365c. Providing inactive init, t, and sfq signals causes the control circuit 270 to operate the fuse cell in the non-programmable mode. To operate the fuse cell in the programmable mode, an inactive init and active sfq and t signals are provided. If a cut fuse is to be simulated in the programmable mode, the d signal is active. On the other hand an inactive d signal causes the fuse cell to simulate an uncut fuse.

The control circuit 270 includes control logic to perform the desired function specified by the tables. As shown in FIG. 3, the control logic comprises initialization, fuse, and software programmable fuse control circuitry 361, 362, and 363.

In one embodiment, the initialization control circuitry 361 comprises first and second nand gates 331 and 332. The nand gates 331, 332 include first and second input terminals and an output terminal. One input terminal of the first nand gate 331 receives the init signal while the other receives the output signal from the second nand gate 332 which receives the t and inverted d input signals. An inverter 335 is provided to invert the d signal to the second nand gate 332. The first nand gate's output terminal is coupled to the gate of the first transistor 371. When the init signal is active (logic 0), the initialization control circuitry 361 generates an active output signal (logic 1) to switch on the first transistor 371, irrespective of the value of t and d signals. Providing inactive init and t signals causes the initialization control circuitry 361 to generate an inactive (logic 0) output signal, switching off the first transistor 371. If an active t signal and an inactive init signal are present, the output of the initialization control circuitry 361 will depend on the d signal (e.g., active output signal (logic 1) is generated if d is active and inactive output signal (logic 0) is generated if d is inactive).

The fuse control circuitry comprises an inverter 336 to invert the output of the initialization control block 361. The output of the inverter is coupled to the gate of the second transistor 373, thus ensuring that the first and second transistors 371, 373 operate in a push-pull configuration. The software fuse control circuitry comprises a nor gate 338 which receives the sfq and inverted d signals. The output terminal of the nor gate 338 is coupled to the third transistor 375. When sfq is active, the output of the nor gate 363 depends on the state of the d signal. An inactive d with an active sfq signal causes the nor gate 338 to generate an active (logic 1) output signal to switch on the third transistor 375; active d and sfq signals cause the nor gate to generate an inactive (logic 0) output signal to switch off the third transistor 375.

Figure 4:
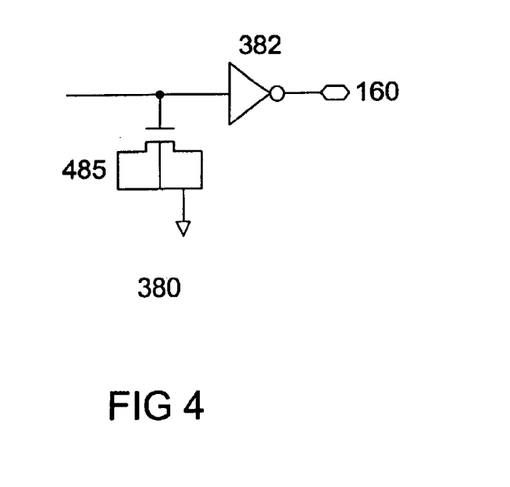

In one embodiment, an output stage 380 is coupled between the second terminal 342 of the latch and fuse cell output terminal 160. The output stage comprises a capacitor 385 coupled between the output terminal and ground. In an alternative embodiment, as shown in FIG. 4, the capacitor comprises a CMOS capacitor 485 such as p-FET. The capacitor serves to stabilize the fuse cell output from glitches. An inverter 382 may optionally be provided to switch the logic of the fuse cell output signal.

Figure 5:
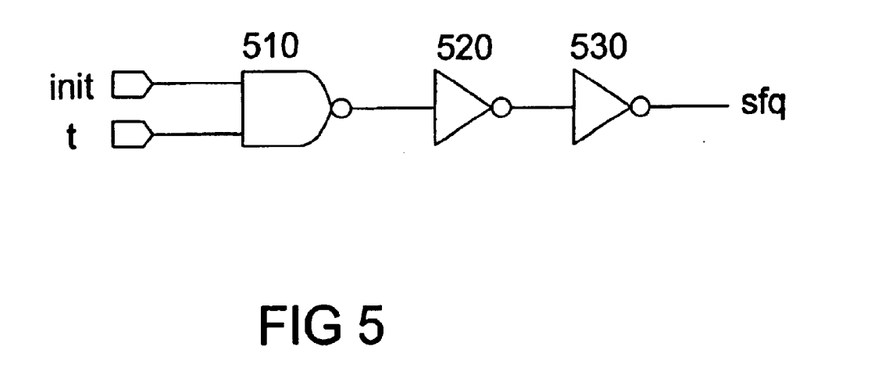

FIG. 5 shows the generation of sfq signal in accordance with one embodiment of the invention. The sfq signal is derived from the init and t signals. In one embodiment, sfq signal is active (logic 0) when init is deactivated (logic 1) and t is activated (logic 1). In one embodiment, the sfq signal is derived by providing the init and t signals to a nand gate 510. First and second inverters 520, 530 may be provided to serve as a buffer for the output of the nand gate 510.

Figure 6:
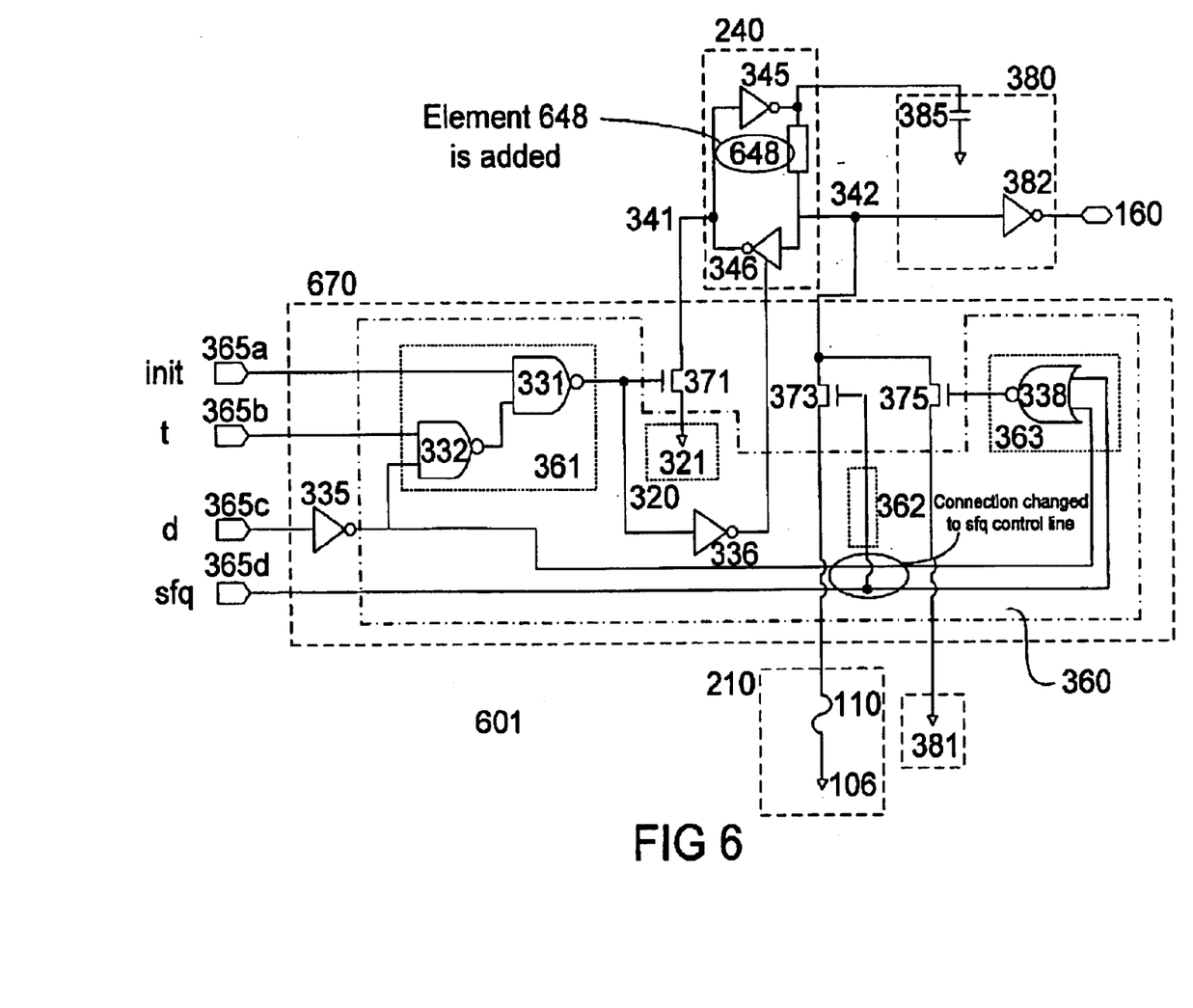

FIG. 6 shows a fuse cell 601 in accordance with another embodiment of the invention. The fuse cell 601, as shown, provides a valid fuse cell output during initialization. During initialization, either the fuse circuit 210 (non-programmable mode) or software fuse circuit (programmable mode) is coupled to the latch by providing the necessary input control signals (e.g., t, sfq, and d) to the control circuit. The fuse cell output depends on the state of the fuse 110 in the non-programmable mode or the state of the fuse to be simulated in the programmable mode. In one embodiment, the fuse circuit 210 is coupled to the latch 240 during power-up initialization. After initialization, the fuse cell 601 operates in normal operating modes (e.g., programmable or non-programmable) as previously described.

The control circuit 670 is similar to the control circuit 270 of FIG. 3 except that the inverted output signal from the initialization control block 361 is coupled to the enable input of the second latch inverter 346. As a result, the second inverter 346 is deactivated during initialization to sever the feed back path between the second and first latch terminals. This prevents potential contention between the latch terminals 341, 342 in the event that the fuse is uncut.

Note that in the arrangement of FIG. 6, the transistor 373 is controlled by the input sfq directly. This means that the table given in Table 2 is adjusted so that the transistor 373 is "on" in the initialization and non-programmable modes, and "off" in the programmable mode (irrespective of which state is to be simulated). Since the transistor is "on" in the initialization mode, the state of the fuse 110 determines the state of the latch in that state also—not just in the non-programmable mode.

Figure 7:
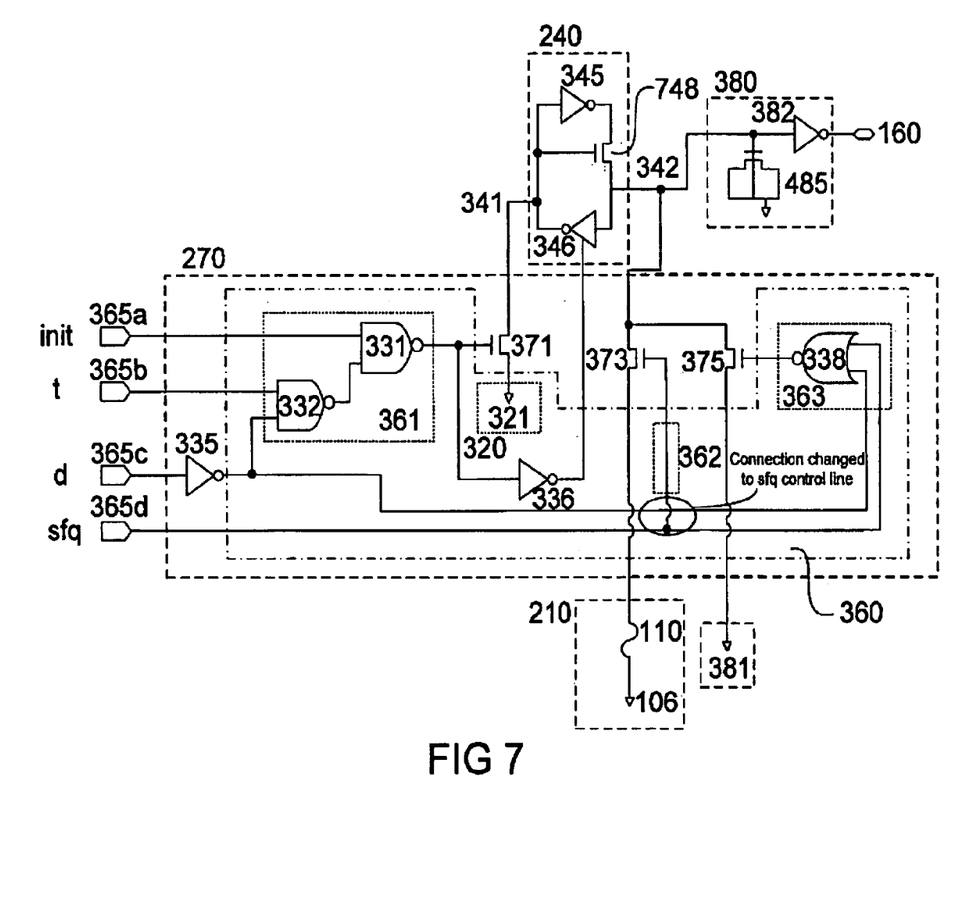

A resistor 648 can be commonly coupled to the inverters (e.g., output terminal of the first inverter 345 and input terminal of the second inverter 346) and the second latch terminal 342. The resistor 648 serves to reduce power dissipation during initialization if the fuse 110 is uncut. In an alternative embodiment, the resistor 648 can be implemented using a transistor 748 such a p-FET, as shown in FIG. 7.

An optional output stage 380, as described in FIGS. 3 and 4, may be provided between the second terminal 342 of the latch and the fuse cell output terminal 160. Alternatively, as shown in FIG. 6, one terminal of capacitor 385 is commonly coupled to the resistor 648 and first inverter 345 of the latch while the other terminal is coupled to ground. In FIG. 6 the initialization control circuit 361, fuse circuit 362, initialization circuit 321 and inverter 363 of the software programmable fuse control circuitry are collectively shown as control logic 360.

Figure 8:
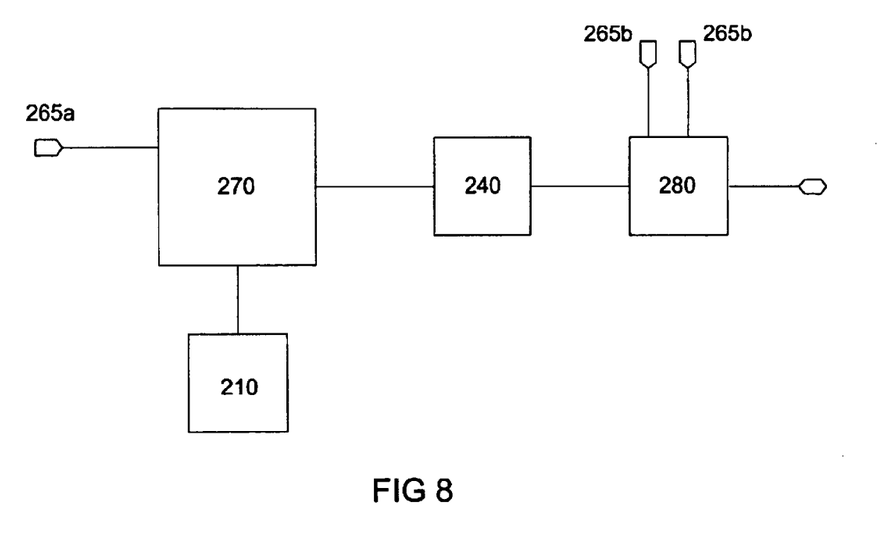

Turning now to FIG. 8, a further embodiment of the invention is shown. In this embodiment the control circuit 270 receives only an init signal, through input terminal 265a, and the software programmable fuse circuit 280 is instead located at an output of the latch 240, where according to the control signals the fuse circuit receives it can either operate in a first operating mode in which it transmits the output of the latch 240 to its own output, or else in a second operating mode in which it ignores the output of the latch 240 and instead outputs a signal determined based on the inputs 265b.

The form of the control circuit 270 in this case may be the same as the control circuit 270 of FIG. 3, but with the software programmable fuse circuitry (i.e. circuits 361, 363, 381 and transistor 375) removed so that the input 365a controls the transistors 371, 373 directly in a push-pull arrangement. The inputs 365b, 365c and 365d of FIG. 3 are then redundant, and are replaced by inputs 265b to the software programmable fuse circuit 280.

Figure 9:
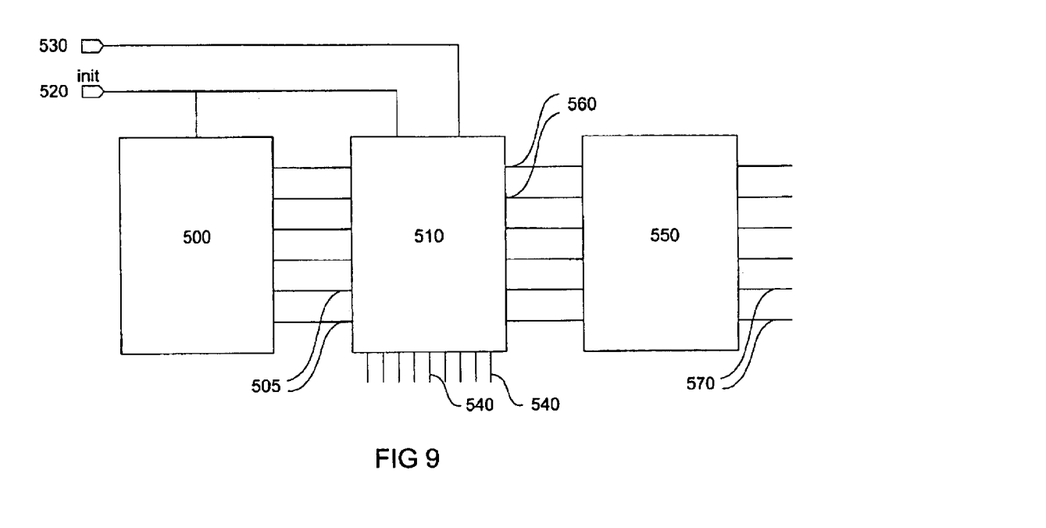

FIG. 9 shows a block diagram of an arrangement in which there are 10 fuse cells of the form shown in FIG. 8. The control circuits 270, fuse circuits 210 and latches 240 of each of these 10 fuse cells are located in a fuse block 500. The software programmable fuse circuits 280 of each of the 10 fuse cells are located in a softfuseblock 510. The respective latches 240 and software programmable fuse cells are connected by leads 505. An init signal is received at a terminal 520 and transmitted to both the fuse block 500 and softfuse block 510. A softfuse block enable signal is transmitted to each software programmable fuse circuit 280 from an input 530, which tells the software programmable fuse circuits whether to transmit the outputs of the respective latches 240 or alternatively to simulate a fuse state. Each of the software programmable fuse circuits 280 receives a respective input signal from a respective input 540 which tells it which fuse state to simulate in the case that the input 530 indicates that simulation is to be done.

Optionally, the softfuse block may not be enabled (i.e. even if the input 530 indicated that simulation is to be done, the softfuse block 510 may actually output the signals which it receives from the fuse block 500) in the case when the init signal indicates that the fuse block is in the initialization stage. This is because at such moments (e.g. during power-up) the inputs 540 may not be well-defined.

A buffer block 550 is provided, having a respective buffer for each fuse. A lead 560 transmits the output of the respective software programmable fuse circuit 280 to this buffer. The buffer can then output it through a respective output 570.

While the invention has been particularly shown and described with reference to various embodiments, it will be recognized by those skilled in the art that modifications and changes may be made to the present invention without departing from the spirit and scope thereof. The of the invention should therefore be determined not with reference to the above description but with reference to the appended claims along with their full scope of equivalents.

What is claimed is:

1. A fuse cell comprising:

fuse input terminals for receiving input signals;

a fuse output terminal;

a control circuit coupled to the input terminals;

an initialization circuit coupled to the control circuit;

a fuse circuit coupled to the control circuit, the fuse circuit comprising a fuse having a first or a second fuse state;

a latch coupled to the fuse output terminal and the control circuit, the latch having first and second latch states, wherein the first latch state causes a fuse output signal to be in a first logic state and the second latch state causes the fuse output signal to be in a second logic state; and a software programmable fuse circuit coupled to the control circuit; and in response to the input signals at the input terminals, the fuse cell operates in an initialization mode or in a first or second mode of fuse cell operation, wherein during initialization, the control circuit couples the initialization circuit to the latch to initialize the latch;

in the first mode of operation, the control circuit couples the fuse circuit to the latch, wherein the latch is in either the first or second state depending on the fuse state; and in the second mode of operation, the software programmable fuse circuit causes the fuse output signal to be in either the first or second logic state based on the input signals.

2. A fuse cell according to claim 1 in which the software programmable fuse circuit is coupled to the latch, and in the second mode of operation the software programmable fuse circuit controls the latch based on the input signals to simulate the states of the fuse.

3. The fuse cell according to claim 1 in which the software programmable fuse circuit is coupled to an output of the latch instead of the control circuit and based on the input signals selectively in the first mode of operation outputs a signal which is determined by the output of the latch or in the second mode of operation outputs a signal which is determined by the input signals.

4. A programmable fuse cell comprising:

fuse input terminals for receiving input signals;

a programmable fuse cell output terminal;

a control circuit coupled to the input terminals for controlling the programmable fuse cell;

a fuse circuit coupled to the control circuit, the fuse circuit comprising a fuse having a first or a second fuse state;

a latch coupled to the fuse cell output terminal and the control circuit, the latch having first and second latch states, wherein the first latch state causes a fuse output signal to be in a first logic state and the second latch state causes the fuse output signal to be in a second logic state;

a software programmable fuse circuit coupled to the control circuit; and in response to the input signals at the input terminals, the fuse cell operates in a first or second mode;

wherein the first mode comprises the control circuit coupling the fuse circuit to the latch to cause the latch to be in either the first or second state depending on fuse state; and wherein the second mode comprises the software programmable fuse circuit to cause the fuse output signal to be in either the first or second logic state to simulate first or second fuse state based on the input signals.

5. The programmable fuse cell of claim 4 wherein:

the software programmable fuse circuit comprises a software fuse reference voltage;

the fuse circuit comprises a fuse reference voltage, the fuse is coupled to the fuse reference voltage in the first fuse state and decoupled from the fuse reference voltage in the second fuse state; and wherein the fuse reference voltage and the software fuse reference voltage comprise ground.

6. The programmable fuse cell of claim 4 further comprises an initialization mode for initializing the latch to a known state and wherein the control circuit comprises an initialization circuit which includes an initialization reference voltage, the control circuit couples the initialization circuit to the latch in the initialization mode.

7. The programmable fuse cell of claim 6 wherein:

the software programmable fuse circuit comprises a software fuse reference voltage;

the fuse circuit comprises a fuse reference voltage, the fuse is coupled to the fuse reference voltage in the first fuse state and decoupled from the fuse reference voltage in the second fuse state; and wherein the fuse reference voltage and the software fuse reference voltage comprise ground.

8. The programmable fuse cell of any one of claims 4–7 further comprises a plurality of fuse programmable cells to form a fuse block.

9. The programmable fuse cell of claims 8 wherein:

in the first mode, the control circuit couples the fuse circuit to the latch and decouples the initialization and software fuse circuits from the latch; and in the second mode, to simulate the first fuse state, the initialization circuit is decoupled from the latch and the software programmable fuse circuit is coupled to the latch, and to simulate the second fuse state, the fuse and software programmable fuse circuits are decoupled from the latch and the initialization circuit is coupled to the latch.

10. The programmable fuse cell of claim 8 further comprises an output stage coupled between the latch and the fuse cell output terminal to stabilize the fuse output signal.

11. The programmable fuse cell of claim 6 or 7 wherein:

in the initialization mode, the control circuit couples the initialization circuit to the latch and decouples the fuse and software programmable fuse circuit form the latch;

in the first mode, the control circuit couples the fuse circuit to the latch and decouples the initialization and software fuse circuits from the latch; and in the second mode, to simulate the first fuse state, the initialization circuit is decoupled from the latch and the software programmable fuse circuit is coupled to the latch, and to simulate the second fuse state, the fuse and software programmable fuse circuits are decoupled from the latch and the initialization circuit is coupled to the latch.

12. The programmable fuse cell of claim 11 further comprises a plurality of fuse programmable cells to form a fuse block.

13. The programmable fuse cell of claim 11 further comprises an output stage coupled between the latch and the fuse cell output terminal to stabilize the fuse output signal.

14. A programmable fuse cell comprising:

a fuse input terminal for receiving a fuse input signal;

a programmable fuse cell output terminal;

a control circuit coupled to the input terminal for controlling the programmable fuse cell;

a fuse circuit coupled to the control circuit, the fuse circuit comprising a fuse having a first or a second fuse state;

a latch coupled to the fuse cell output terminal and the control circuit, the latch having first and second latch states, wherein the first latch state causes a fuse output signal to be in a first logic state and the second latch state causes the fuse output signal to be in a second logic state;

a software programmable fuse circuit coupled between a latch output terminal and the fuse cell output terminal, the software programmable fuse circuit receives software programmable fuse input signals; and in response to the input signal at the input terminal, the fuse cell operates in a first or second mode;

wherein the first mode comprises the control circuit coupling the fuse circuit to the latch to cause the latch to be in either the first or second state depending on whether the fuse is in the first or second state and causing the fuse output signal to be in either a first or a second logic state depending on which state the latch is in; and wherein the second mode comprises decoupling the latch from the output terminal and activating the software programmable fuse circuit to cause the fuse output signal to be in either the first or second logic state to simulate first or second fuse state based on the software programmable fuse input signals.

15. The programmable fuse cell of claim 14 wherein:

the software programmable fuse circuit comprises a software fuse reference voltage and software programmable fuse activation circuit;

the fuse circuit comprises a fuse reference voltage, the fuse is coupled to the fuse reference voltage in the first fuse state and decoupled from the fuse reference voltage in the second fuse state; and wherein the fuse reference voltage and the software fuse reference voltage comprise ground.

16. The programmable fuse cell of claim 14 further comprises an initialization mode for initializing the latch to a known state and wherein the control circuit comprises an initialization circuit which includes an initialization reference voltage, the control circuit couples the initialization circuit to the latch in the initialization mode.

17. The programmable fuse cell of claim 16 wherein:

the software programmable fuse circuit comprises a software fuse reference voltage and software programmable fuse activation circuit;

the fuse circuit comprises a fuse reference voltage, the fuse is coupled to the fuse reference voltage in the first fuse state and decoupled from the fuse reference voltage in the second fuse state; and wherein the fuse reference voltage and the software fuse reference voltage comprise ground.

18. The programmable fuse cell of any one of claims 14–17 further comprises a plurality of fuse programmable cells to form a fuse block.

19. The programmable fuse cell of any one of claims 14–17 further comprises an output stage coupled between the software programmable fuse circuit and the fuse cell output terminal to stabilize the fuse output signal.

* * * * *